(12) United States Patent
Lam et al.

(10) Patent No.: US 9,219,231 B2
(45) Date of Patent: Dec. 22, 2015

(54) PHASE CHANGE MEMORY CELLS WITH SURFACTANT LAYERS

(71) Applicant: International Business Machines Corporation, Armonk, NY (US)

(72) Inventors: Chung H. Lam, Yorktown Heights, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 14/180,344

(22) Filed: Feb. 13, 2014

(65) Prior Publication Data

US 2014/0158971 A1 Jun. 12, 2014

Related U.S. Application Data

(63) Continuation of application No. 13/092,175, filed on Apr. 22, 2011, now abandoned.

(51) Int. Cl.
*H01L 45/00* (2006.01)

(52) U.S. Cl.
CPC ............ *H01L 45/1253* (2013.01); *H01L 45/06* (2013.01); *H01L 45/124* (2013.01); *H01L 45/1233* (2013.01); *H01L 45/1246* (2013.01); *H01L 45/141* (2013.01); *H01L 45/1683* (2013.01)

(58) Field of Classification Search
CPC ... H01L 45/06; H01L 45/144; H01L 45/1233; H01L 45/126; H01L 45/1683; H01L 45/143; H01L 27/2409; H01L 45/04; H01L 45/1608; H01L 45/14; H01L 45/141; H01L 27/11582
USPC ........................................ 257/2, 4, 5, E45.002
See application file for complete search history.

(56) References Cited

U.S. PATENT DOCUMENTS

| | | | |
|---|---|---|---|
| 8,283,650 B2 | 10/2012 | Breitwisch et al. | ................ 257/4 |
| 2006/0237756 A1* | 10/2006 | Park et al. | ...................... 257/296 |
| 2008/0173858 A1* | 7/2008 | An et al. | ............................ 257/3 |
| 2009/0029031 A1* | 1/2009 | Lowrey | ................... H01L 45/06 427/58 |
| 2009/0227092 A1* | 9/2009 | Fournier | ................. H01L 45/06 438/483 |
| 2010/0301988 A1 | 12/2010 | Czubatyj et al. | ................. 338/13 |
| 2011/0155985 A1 | 6/2011 | Oh et al. | ............................ 257/2 |

* cited by examiner

*Primary Examiner* — Minh-Loan Tran
(74) *Attorney, Agent, or Firm* — Ido Tuchman; Vazken Alexanian

(57) ABSTRACT

An example embodiment is a phase change memory cell including a bottom electrode and phase change material carried within a via above the bottom electrode. A surfactant layer is deposited above the bottom electrode. The surfactant layer includes a surfactant configured to lower an interfacial force between the phase change material and the via surface.

12 Claims, 5 Drawing Sheets

PHASE CHANGE MEMORY CELLS WITH SURFACTANT LAYERS

CROSS-REFERENCE TO RELATED APPLICATIONS

This application is a continuation of and claims priority under 35 U.S.C. §120 to U.S. patent application Ser. No. 13/092,175 ("PHASE CHANGE MEMORY CELLS WITH SURFACTANT LAYERS") filed Apr. 22, 2011.

BACKGROUND

The present invention is directed toward computer memory, and more particularly to a non-volatile phase change memory devices and methods for fabrication such devices.

There are two major groups in computer memory: non-volatile memory and volatile memory. Constant input of energy in order to retain information is not necessary in non-volatile memory but is required in the volatile memory. Examples of non-volatile memory devices are Read Only Memory, Flash Electrical Erasable Read Only Memory, Ferroelectric Random Access Memory, Magnetic Random Access Memory, and Phase Change Memory. Examples of volatile memory devices include Dynamic Random Access Memory (DRAM) and Static Random Access Memory (SRAM).

The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Glass chalcogenides are a group of materials commonly utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

SUMMARY

One example of the invention is a method for fabricating a memory cell including phase change material. The method includes forming a bottom electrode within a substrate. A via is formed above the bottom electrode. During a depositing step, a surfactant layer is deposited above the bottom electrode. The surfactant layer includes a surfactant configured to lower an interfacial force between the phase change material and the via surface. A further depositing step deposits the phase change material within the via.

Another example of the invention is a phase change memory cell. The memory cell includes a bottom electrode and phase change material carried within a via above the bottom electrode. A surfactant layer is positioned above the bottom electrode. The surfactant layer includes a surfactant configured to lower an interfacial force between the phase change material and the via surface.

Yet another example of the invention is an array of phase change memory cells. Each phase change memory cell in the array includes a bottom electrode and phase change material carried within a via above the bottom electrode. A surfactant layer is positioned above the bottom electrode. The surfactant layer includes a surfactant configured to lower an interfacial force between the phase change material and the via surface.

DETAILED DESCRIPTION

Figure 1:
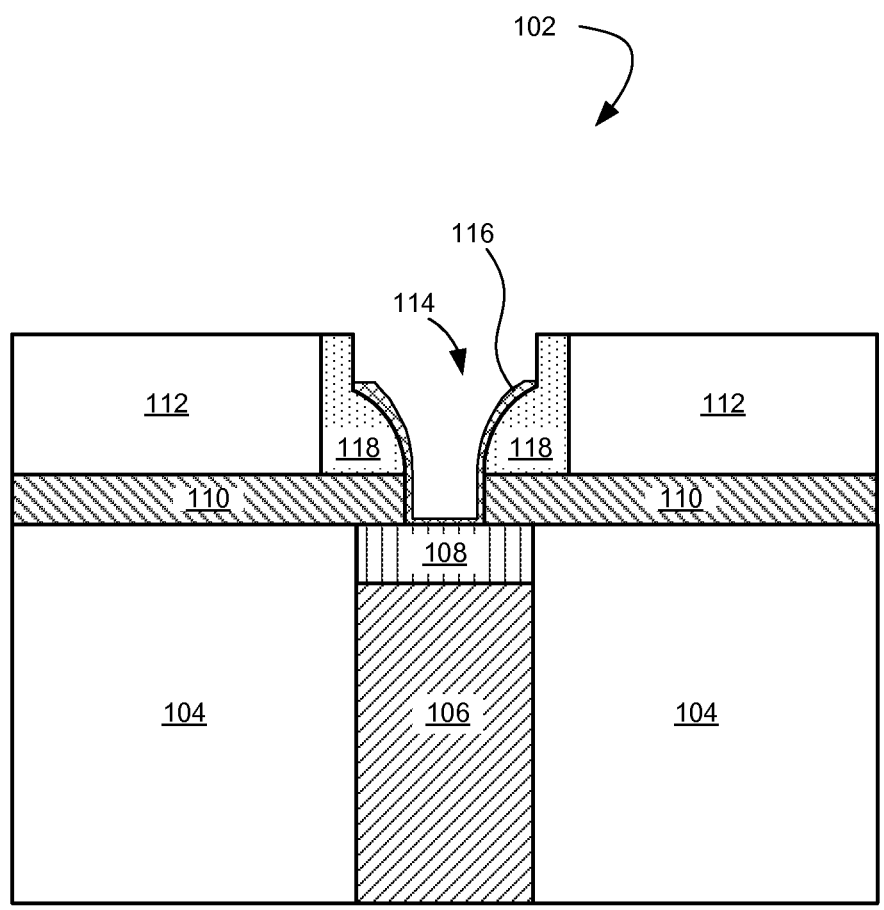
FIG. 1 shows an example phase change memory cell contemplated by the present invention.

The present invention is described with reference to embodiments of the invention. Throughout the description of the invention reference is made to FIGS. 1-5. When referring to the figures, like structures and elements shown throughout are indicated with like reference numerals.

Embodiments of the invention include phase change memory cells incorporating a surfactant along the surface of a via containing phase change material. When the phase change material is melted, the surfactant beneficially facilitates capillary forces within the via to bring the phase change material down to the bottom of the via.

FIG. 1 shows an example phase change memory cell 102 contemplated by the present invention. The memory cell 102 is comprised of an insulating substrate 104 and a bottom electrode 106 within the insulating substrate 104.

The insulating substrate 104 may be deposited as part of a starting front end of line (FEOL) wafer. The insulating substrate 104 may be composed of, for example, silicon dioxide ($SiO_2$). The bottom electrode 106 may be constructed from, but is not limited to, titanium nitride (TiN), tungsten (W), silver (Ag), gold (Au), or aluminum (Al). A conductive plug 108 may be deposited over the bottom electrode 106. In one embodiment, the conductive plug is made of tungsten.

The memory cell 102 further includes one or more intermediate insulating layers 110 and 112 forming a via 114 above the bottom electrode 106. A surfactant layer 116 is deposited above the bottom electrode along the surface of the via 114. It is contemplated that the surfactant layer may be deposited using atomic layer deposition (ALD). As discussed in more detail below, the surfactant layer 116 includes a surfactant configured to lower an interfacial force between the phase change material and the via surface.

In one embodiment, the memory cell 102 includes a step spacer 118 within the via 114. The step spacer 118 narrows a portion of the via proximate the bottom electrode 106. In a particular configuration, the via 114, in combination with the step spacer 118, has a substantially T-shaped cross section.

Figure 2:
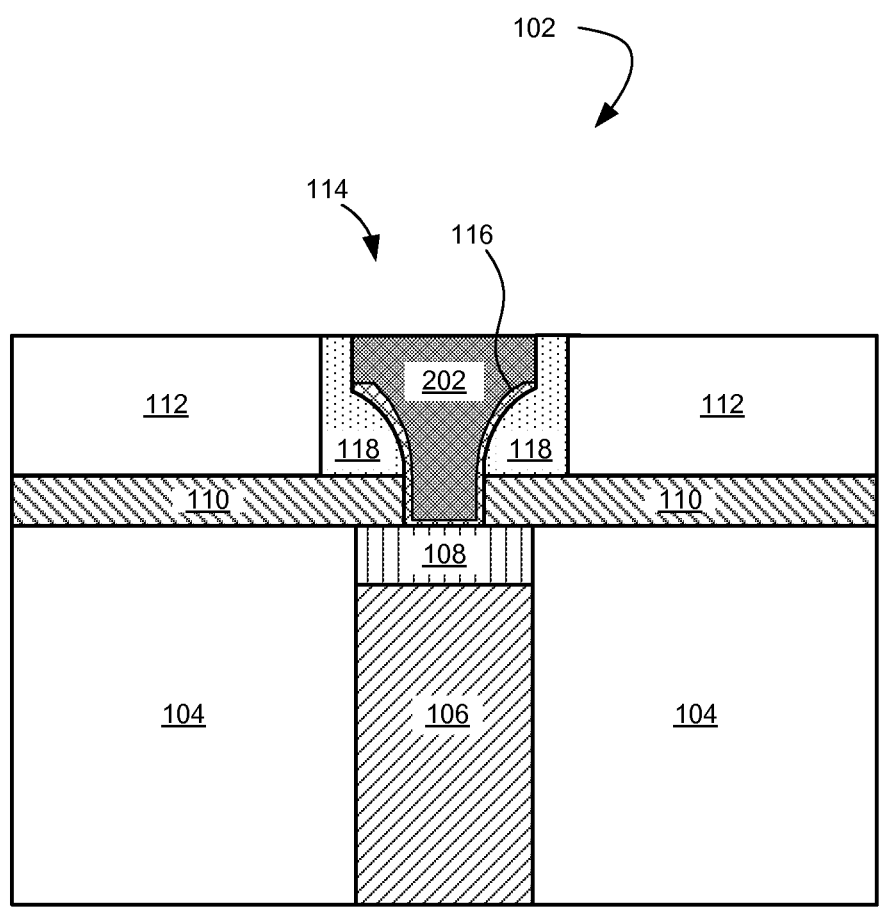
FIG. 2 shows the memory cell with phase change material deposited in a via such that the phase change material is carried within the via and above a bottom electrode.

In FIG. 2, the memory cell 102 is shown with phase change material 202 deposited in the via 114 such that the phase change material 202 is carried within the via 114 and above the bottom electrode 106. When the phase change material 202 is melted, the phase change material 202 flows down the via 114 and makes electrical contact with the bottom electrode 106.

As mentioned above, the surfactant is configured to lower an interfacial force between the phase change material and the via surface. Thus, the surfactant enables a capillary force within the via 114 to overcome the attraction force(s) keeping the phase change material 202 from flowing to the bottom of the via 114 and making an electrical connection with the bottom electrode 106.

The surfactant material should have a short diffusion path when intermixed with the phase change material 202. Preferably, the phase change material 202 should defuse into the surfactant material rather than the surfactant material defusing into the phase change material 202. In one embodiment, the phase change material 202 diffuses into the surfactant material less than 5 Angstroms (approximately 2 to 3 monolayers). The surfactant layer 116 may include materials such as aluminum nitride, boron nitride, aluminum oxide, tantalum nitride, tungsten, tungsten nitride, cobalt tungsten (CoW), nickel tungsten (NiW), and/or yttrium oxide.

Figure 3:
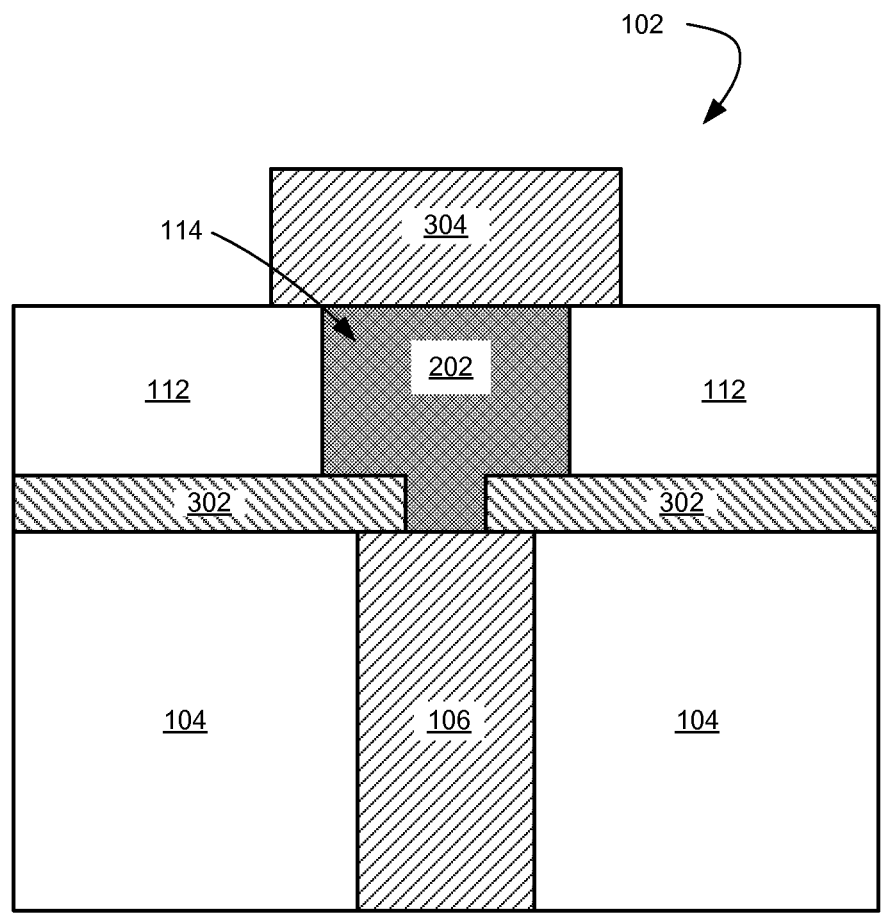
FIG. 3 shows another embodiment of a phase change memory cell contemplated by the present invention.

Turning now to FIG. 3, another embodiment of a phase change memory cell 102 contemplated by the present invention is shown. In this embodiment, the surfactant layer 302 forms a portion of the via surface proximate the bottom electrode 106. A top electrical contact 304 is also pictured over the phase change material 202. As with the previous embodiment, the surfactant layer 302 enables a capillary force within the via 114 to overcome the attraction force(s) keeping the phase change material 202 from flowing to the bottom of the via 114 and making an electrical connection with the bottom electrode 106.

Figure 4:
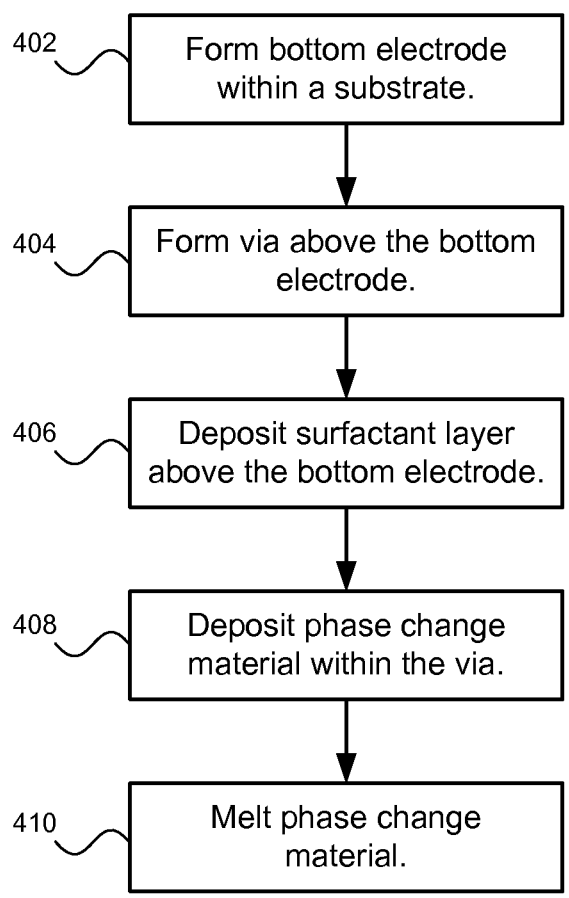
FIG. 4 shows a flowchart illustrating an example method for fabricating a memory cell in accordance with the present invention.

FIG. 4 shows a flowchart illustrating an example method for fabricating a memory cell in accordance with the present invention. The fabrication process begins at forming operation 402 where a bottom electrode is formed within a substrate. As discussed above, the substrate is an electrical insulator and the bottom electrode may include a plug at its top portion. After forming operation 402 is completed the process continues to forming operation 404.

At forming operation 404, a via is formed above the bottom electrode. The via is etched from one or more intermediate insulating layers above the bottom electrode. In one embodiment, a lithography mask with photo resist above the intermediate insulating layers is deposited. The photo resist is pattern so that the area above the bottom electrode is exposed to the proceeding etch. The etch can then be performed using, for example, an anisotropic reactive-ion etch (RIE) process. The photo resist is then stripped from the surface of the upper intermediate insulating layer.

In one embodiment of the invention, forming operation 404 may include forming a step spacer within the via that narrows a portion of the via proximate the bottom electrode. The step spacer is created by forming an undercut below an upper intermediate insulating layer. The undercut can be formed by performing a dilute HF wet etch where the HF attacks a silicon dioxide layer more rapidly than a silicon nitride or amorphous silicon layer. Next, a conformal insulating layer is deposited in the via. The conformal insulating layer creates a keyhole cavity within the via. In one embodiment of the invention, amorphous silicon is used as the conformal insulating layer. The conformal insulating layer can be deposited, for example, by chemical vapor deposition (CVD). Next, the step spacer is defined by anisotropic selective reactive-ion etch. The reactive-ion etch removes all of the conformal insulating material above and below the keyhole cavity and stops on a lower insulating layer or the bottom electrode.

After forming operation 404 is completed the process may include removing the remaining conformal insulating layer, based on cell design, using a suitable wet etching. Next, depositing operation 406 follows. At depositing operation 406, a surfactant layer is deposited above the bottom electrode. The surfactant layer includes a surfactant configured to lower an interfacial force between the phase change material and the via surface. In one embodiment, the surfactant layer is deposited within the via between the bottom electrode and the phase change material after formation of the via. However, as discussed above, it is contemplated that the via may be formed after deposition of the surfactant layer such that the surfactant layer forms a portion of the via surface proximate the bottom electrode. In one embodiment, the surfactant layer is deposited using atomic layer deposition (ALD).

After depositing operation 406 is completed, the process continues to depositing operation 408. During depositing operation 408, phase change material is deposited within the via. The phase change material can be comprised of a chalcogenide. Chalcogenides are comprised of a chalcogen (Periodic Table Group 16/Group VIA) and a more electropositive element. An example of phase change materials are $Ge_2Sb_2Te_5$ (GST), $In_2Se_3$, GeSb and SbTe. After depositing operation 408 is completed the process continues to melting operation 410.

At melting operation 410, the phase change material is heated to its melting point. As discussed above, at least part of the phase change material interacts with the surfactant, causing it to flow to the bottom of the via. The surfactant lowers the interfacial energy between the phase change material and the via surface so that the phase change material flows down the via due to capillary action.

The fabrication process may continue with a planarizing Chemical Mechanical Polishing (CMP) step followed by deposition of a Top Electrical Contact (TEC) above the phase change material. The TEC may be comprised of, but not limited to, TiN, TaN, tungsten (W), or other suitable material that do not inter diffuse with the phase change material. Furthermore, for a full cell integration, a top electrode may be formed with any suitable Back End of the Line (BEOL) metal such as copper (Cu) or aluminum (Al).

Figure 5:
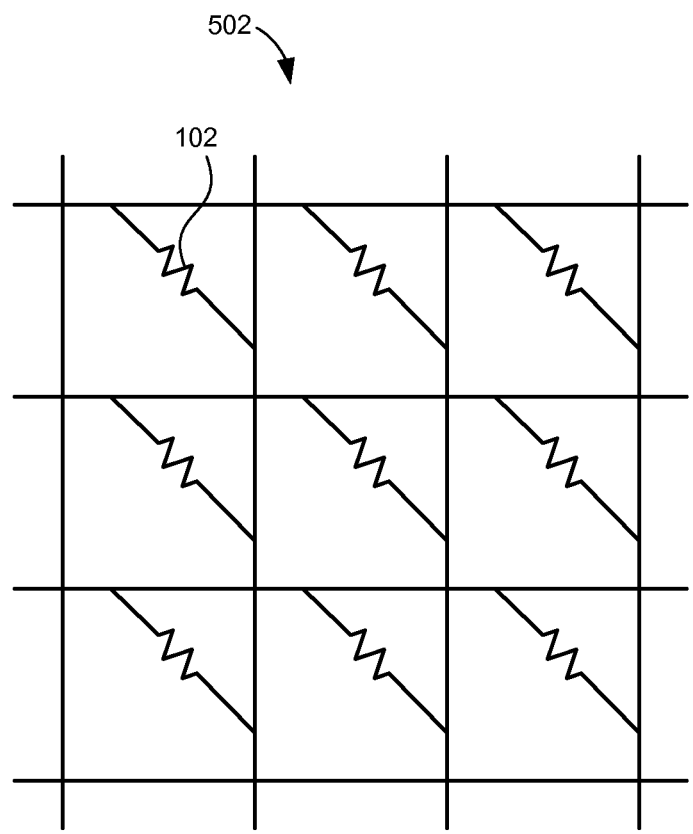
FIG. 5 shows an array of phase change memory cells in accordance with an embodiment of the present invention.

FIG. 5 shows an array of phase change memory cells 502. As discussed above, each phase change memory cell 102 in the array includes a bottom electrode, phase change material carried within a via above the bottom electrode, and a surfactant layer above the bottom electrode. The surfactant layer includes a surfactant configured to lower an interfacial force between the phase change material and the via surface.

Having described embodiments for the invention (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A phase change memory cell comprising:
   a bottom electrode;
   phase change material carried within a via above the bottom electrode; and a surfactant layer above the bottom electrode, the surfactant layer including a surfactant configured to lower an interfacial force between the phase change material and a surface of the via.

2. The phase change memory cell of claim 1, further comprising a step spacer within the via, the step spacer narrowing a portion of the via proximate the bottom electrode.

3. The phase change memory cell of claim 1, wherein the surfactant layer is positioned within the via between the bottom electrode and the phase change material.

4. The phase change memory cell of claim 1, wherein the surfactant layer forms a portion of the surface of the via proximate the bottom electrode.

5. The phase change memory cell of claim 1, wherein the surfactant layer includes one or more of aluminum Nitride, boron nitride, aluminum oxide, tantalum nitride, tungsten, tungsten nitride, cobalt tungsten (CoW), nickel tungsten (NiW), and yttrium oxide.

6. The phase change memory cell of claim 1, wherein the via has a substantially T-shaped cross section.

7. An array of phase change memory cells, each phase change memory cell in the array comprising:
a bottom electrode;
phase change material carried within a via above the bottom electrode; and
a surfactant layer above the bottom electrode, the surfactant layer including a surfactant configured to lower an interfacial force between the phase change material and a surface of the via.

8. The array of phase change memory cells of claim 7, further comprising a step spacer within the via, the step spacer narrowing a portion of the via proximate the bottom electrode.

9. The array of phase change memory cells of claim 7, wherein the surfactant layer is positioned within the via between the bottom electrode and the phase change material.

10. The array of phase change memory cells of claim 7, wherein the surfactant layer forms a portion of the surface of the via proximate the bottom electrode.

11. The array of phase change memory cells of claim 7, wherein the surfactant layer includes one or more of aluminum Nitride, boron nitride, aluminum oxide, tantalum nitride, tungsten, tungsten nitride, cobalt tungsten (CoW), nickel tungsten (NiW), and yttrium oxide.

12. The array of phase change memory cells of claim 7, wherein the via has a substantially T-shaped cross section.

* * * * *